United States Patent [19]

Maeda et al.

[11] Patent Number: 5,300,939

[45] Date of Patent: Apr. 5, 1994

[54] METHOD AND APPARATUS FOR MEASURING ANTENNA RADIATION EFFICIENCY

[75] Inventors: Tadahiko Maeda, Yokohama; Yoshiaki Tsukumo, Tokyo; Satoshi Yasuda, Kawasaki; Syuuichi Sekine; Shuichi Obayashi, both of Urayasu, all of Japan

[73] Assignee: Kabushiki Kaisha Toshiba, Kawasaki, Japan

[21] Appl. No.: 851,482

[22] Filed: Mar. 13, 1992

[30] Foreign Application Priority Data

Mar. 14, 1991 [JP] Japan .................. 3-074833

[51] Int. Cl.$^5$ .......................... H01Q 1/12; G01R 29/08
[52] U.S. Cl. .................................. 343/703
[58] Field of Search .................. 343/703, 853; H01Q 3/02–3/10, 25/00

[56] References Cited

PUBLICATIONS

Proceedings of the IRE, Aug. 1989, pp. 1325–1331, H. A. Wheeler, "The Radiansphere Around A Small Antenna".
IEEE Transactions On Antennas and Propagation, vol. AP-23, No. 4, Jul. 1975, pp. 457–461, E. H. Newman, et al., "Two Methods For The Measurement of Antenna Efficiency".
IEEE Transactions On Vehicular Technology, vol. VT-26, No. 4, Nov. 1977, pp. 349–357, J. B. Andersen, et al., "Antennas For VHF/UHF Personal Radio: A Theoretical And Experimental Study Of . . . ".
(A Japanese Publication), B vol. J 71-B, No. 11, 1988, pp. 1259–1265, Tadahiko Maeda, et al., "Experimental Studies And Improvements On The Accuracy Of The Indoor Random Field Measurement Method . . . ".
IEEE Tokyo Section, Denshi Tokyo No. 28, 2989, pp. 143–147, Tadahiko Maeda, et al., "The Development Of An Antenna Radiation Efficiency Measurement Method Including The Effects On The Human . . . ".

*Primary Examiner*—Michael C. Wimer
*Attorney, Agent, or Firm*—Oblon, Spivak, McClelland, Maier & Neustadt

[57] ABSTRACT

The present invention relates to an apparatus for measuring antenna radiation efficiency, wherein a random field measurement method can be adopted. In this apparatus, a to-be-measured antenna and a standard antenna are situated in a frame. In the frame, a plurality of rods, which are horizontally movable and extend vertically, are supported. A plurality of radio wave scatterers whose intervals and curvatures can be determined at random are held to the rods. In the frame, a random field is created by the radio wave scatterers.

16 Claims, 15 Drawing Sheets

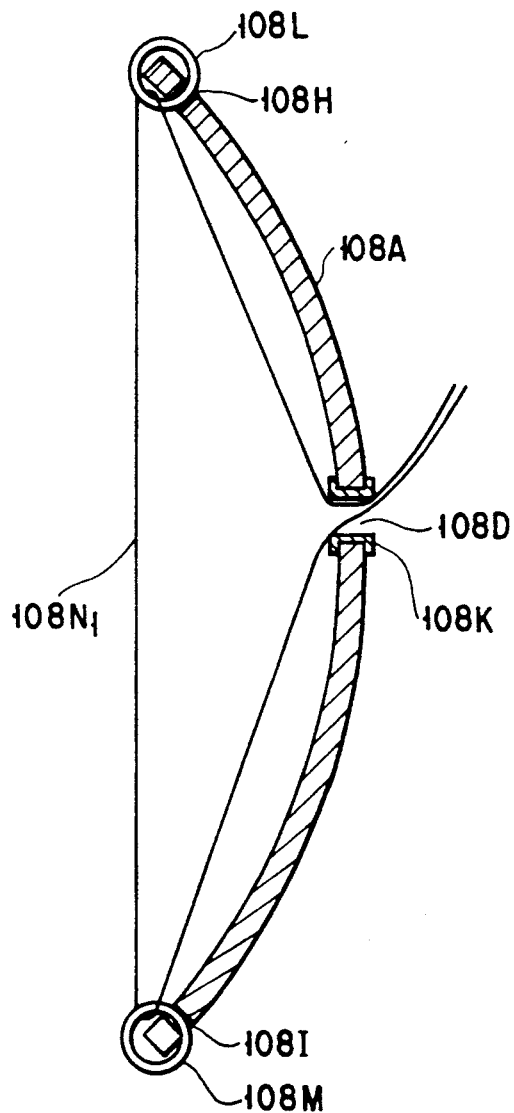
F I G. 5

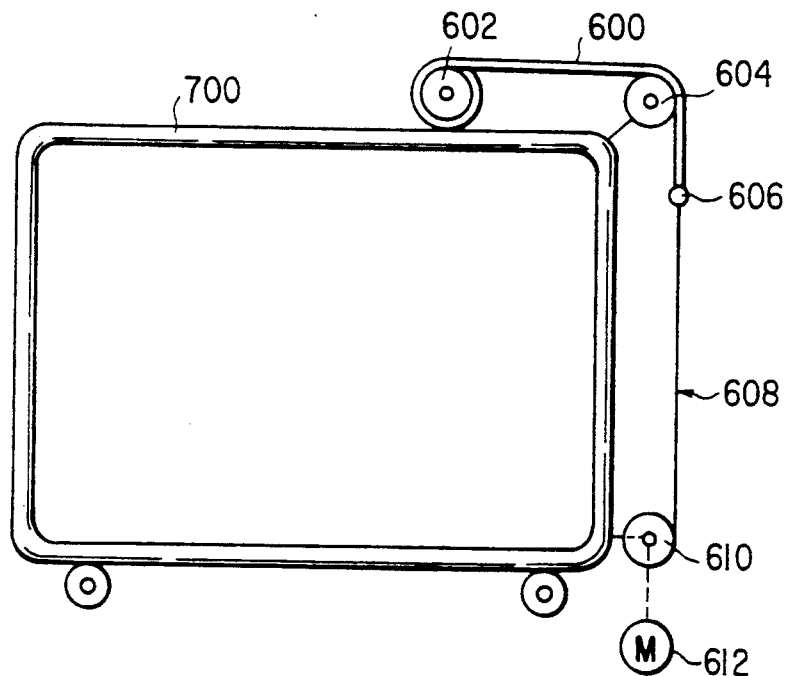
F I G. 8

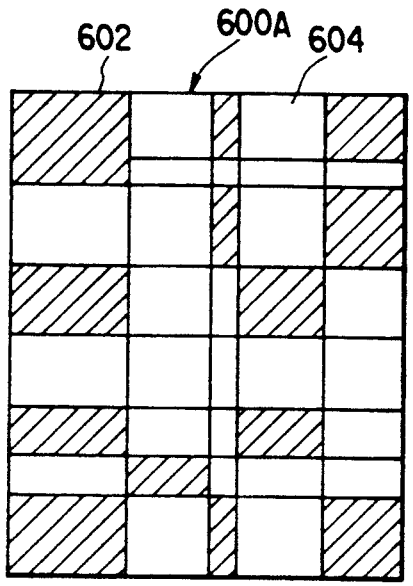
F I G. 9A
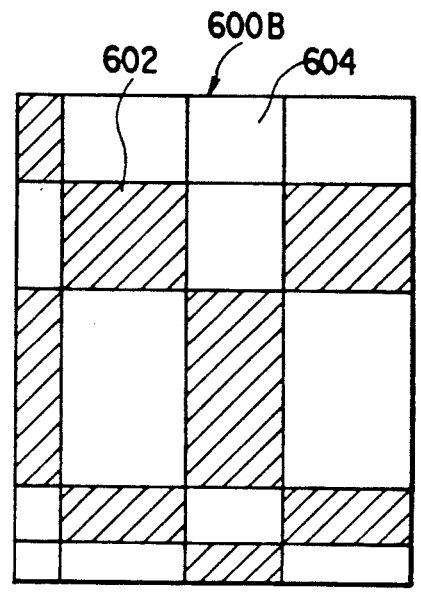
F I G. 9B
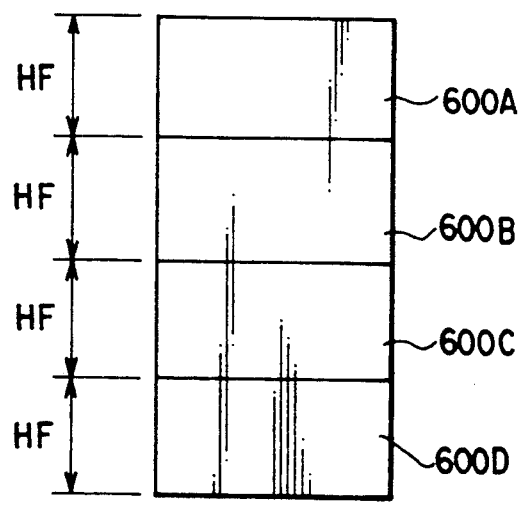
F I G. 9C

METHOD AND APPARATUS FOR MEASURING ANTENNA RADIATION EFFICIENCY

Background of the Invention

1. Field of the Invention

The present invention relates to a method and an apparatus for measuring antenna radiation efficiency, using a random field measurement method.

2. Description of the Related Art

The radiation efficiency (or antenna efficiency) of a small antenna built in portable radio equipment such as a pager or a portable telephone is degraded by influence of electronic parts or human bodies situated near the antenna. In evaluating this type of small antenna, the measurement of radiation efficiency is very important.

An example of the method of measuring antenna radiation efficiency is an indoor random field measurement method. According to this method, radio wave scatterers and radio wave screening members are arranged within a given space, thereby creating an artificial random field. An antenna to be measured is situated in the random field, and the radiation efficiency of this antenna is measured with high precision.

Referring to FIG. 1, an apparatus for measuring antenna radiation efficiency using a conventional random field measurement method will now be described. As is shown in FIG. 1, a random field 10 is created in a given space. The random field 10 comprises mainly radio wave scatterers 12. A standard antenna (transmission antenna) 14 is situated in the random field 10. The antenna 14 is supplied with power from an oscillator 16. A receiving antenna 18 for receiving radio waves from the standard antenna 14 is situated at a predetermined position outside the random field 10. The receiving antenna 18 is attached vertically to an end portion of a rotary arm 22 which is rotated by a motor 20 in a horizontal plane. A reception signal from the receiving antenna 18 is delivered to a field-strength analyzer 28 comprising a field-strength meter 24 and a microcomputer 26. At least one radio wave screening curtain 30 is situated between the random field 10 and the receiving antenna 18. In general, the use of the curtain 30 provide highly precise measurements. In this case, when the use of the curtain 30 reduces measurement precision, the use of curtain 30 is canceled at the process of measurement.

In measuring antenna radiation efficiency, the standard antenna 14 is situated within the random field 10. Transmission power is supplied to the standard antenna 14 from the oscillator 16, thus enabling the antenna 14 to transmit radio waves. The radio waves transmitted from the antenna 14 are received by the receiving antenna 18 which is rotated by the motor 20. The reception signal from the antenna 18 is delivered to the field-strength analyzer 28, thereby obtaining a probability distribution of reception. On the basis of the probability distribution of reception, a graph is created which shows a relationship between relative receiving power (dB) and cumulative probability of reception (%) relating to the standard antenna 14. Next, an antenna to be measured (not shown; hereinafter called "to-be-measured antenna") is situated within the random field 10, like the standard antenna 14. Similar measurement is performed to create a graph showing a relationship between relative receiving power (dB) and cumulative probability of reception (%) relating to the to-be-measured antenna. The radiation efficiency of the to-be-measured antenna is measured from the difference in receiving power in the two graphs under the condition of the same probability.

However, the conventional apparatus for measuring antenna radiation efficiency has the following problems:

(a) Resonance may occur at a specific frequency determined by the shape and arrangement of the radio wave scatterers 12. Owing to the resonance, it is difficult to exactly measure the radiation efficiency in a wide frequency range.

(b) The radio wave scatterers 12 are fixedly arranged; thus, it is not easy to exchange the standard antenna 14 and radio wave scatterers 12, and accordingly the exchange operation is time-consuming and measurement efficiency is low.

(c) It is difficult to change the direction and position of the standard antenna and the to-be-measured antenna, resulting in a low measurement efficiency.

(d) In the prior art, a number of data items enough to confirm a Rayleigh distribution are first obtained to create graphs showing a relationship between relative receiving power (dB) and cumulative probability of reception (%). Based on the graphs, a value (50% value) of the relative receiving power is obtained at the time the cumulative probability of reception is 50%. In this case, if the radio wave scatterers are used, the Rayleigh distribution is easily obtained, but a DDD value (Deviation of Receiving Level Dependent on Antenna Direction Value) must be lowered.

It can be understood, therefore, that the DDD value and the Rayleigh distribution must be confirmed in order to enhance measurement efficiency. It is difficult, however, to confirm the DDD value prior to the confirmation of the Rayleigh distribution, and a high measurement efficiency cannot be attained.

SUMMARY OF THE INVENTION

The object of the present invention is to provide a method and an apparatus for measuring antenna radiation efficiency, which are capable of exactly measuring antenna radiation efficiency over a wide range of frequencies and realizing high measurement efficiency.

This object can be achieved by an apparatus for measuring antenna radiation efficiency, comprising:

a random field forming unit having a plurality of radio wave scatterers, and means for setting at random the intervals between the radio wave scatterers and the curvatures of the radio wave scatterers; a standard antenna, situated within the random field, for transmitting predetermined radio waves, the antenna radiation efficiency of the standard antenna being known in advance;

a to-be-measured antenna, situated within the random field, for transmitting predetermined radio waves, the antenna radiation efficiency of the to-be-measured antenna being unknown in advance;

a receiving antenna, situated apart from the random field, for receiving radio waves from the standard antenna and the to-be-measured antenna;

measurement means for measuring first cumulative probability of the receiving power relating to the standard antenna and second cumulative probability of the receiving power relating to the to-be-measured antenna, on the basis of reception signals received by the receiving antenna; and computation means for computing the antenna radiation efficiency of the to-be-measured antenna on the basis of the first cumulative probability of the receiving power, the second cumulative probability of the receiving power and the antenna radiation efficiency of the standard antenna.

The object can also be achieved by an apparatus for measuring antenna radiation efficiency, comprising:

a random field forming unit having a frame with a predetermined inside space, at least one rod attached vertically to the frame, and a plurality of radio wave scatterers arranged along a longitudinal axis of the rod, a random field being created in the inside space of the frame;

a standard antenna, situated within the random field, for transmitting predetermined radio waves, the antenna radiation efficiency of the standard antenna being known in advance;

a to-be-measured antenna, situated within the random field, for transmitting predetermined radio waves, the antenna radiation efficiency of the to-be-measured antenna being unknown in advance;

a receiving antenna, situated apart from the random field, for receiving radio waves from the standard antenna and the to-be-measured antenna;

first measurement means for receiving radio waves from the standard antenna via the receiving antenna, and measuring first cumulative probability of the receiving power on the basis of the received radio waves;

second measurement means for receiving radio waves from the to-be-measured antenna via the receiving antenna, and measuring second cumulative probability of the receiving power on the basis of the received radio waves;

first computation means for computing difference data of the receiving power at the same value of the cumulative probability of the receiving power, on the basis of the first and second cumulative probabilities of the receiving power; and second computation means for computing the antenna radiation efficiency of the to-be-measured antenna on the basis of the difference data of the receiving power computed by the first computation means and the antenna radiation efficiency of the standard antenna.

The object can also be achieved by a method of measuring antenna radiation efficiency, comprising:

a first step of computing first cumulative probability of the receiving power relating to a standard antenna whose antenna radiation efficiency is known in advance and which is situated in a random field forming unit having a plurality of radio wave scatterers, on the basis of an output from a receiving antenna situated apart from the random field, the intervals and curvatures of the radio wave scatterers being determined at random;

a second step of computing second cumulative probability of the receiving power relating to a to-be-measured antenna whose antenna radiation efficiency is unknown in advance and which is situated in the random field forming unit, on the basis of an output from the receiving antenna;

a third step of computing difference data of the receiving power at the same value of the cumulative probability of the receiving power, on the basis of the first and second cumulative probabilities of the receiving power; and a fourth step of computing the antenna radiation efficiency of the to-be-measured antenna on the basis of the difference data of the receiving power computed by the third step and the antenna radiation efficiency of the standard antenna.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross-sectional view of the radio wave scatterer;

FIG. 8 is a side view of a mechanism for winding a radio wave screening curtain;

FIGS. 9A to 9C are plan views showing radio wave screening curtains;

DETAILED DESCRIPTION OF THE PREFERRED EMBODIMENTS

Figure 1:
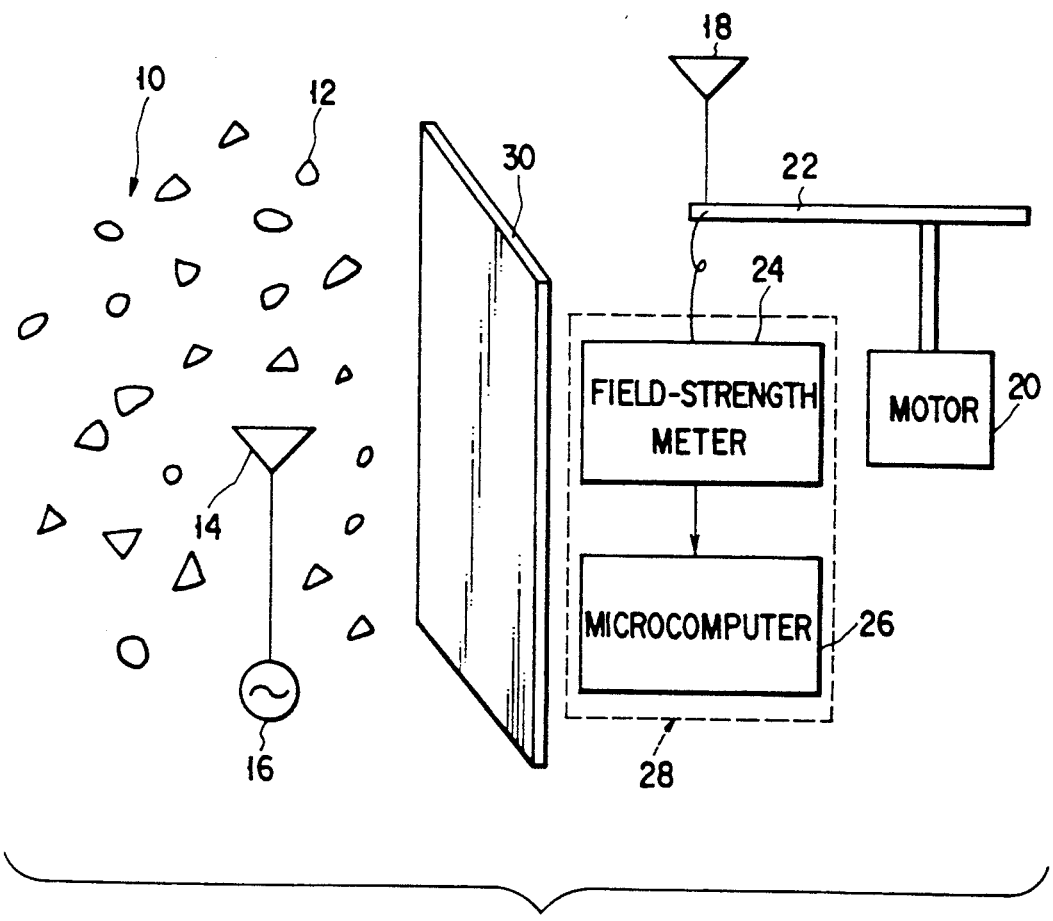
FIG. 1 is a perspective view showing schematically a conventional apparatus for measuring antenna radiation efficiency.
Figure 2:
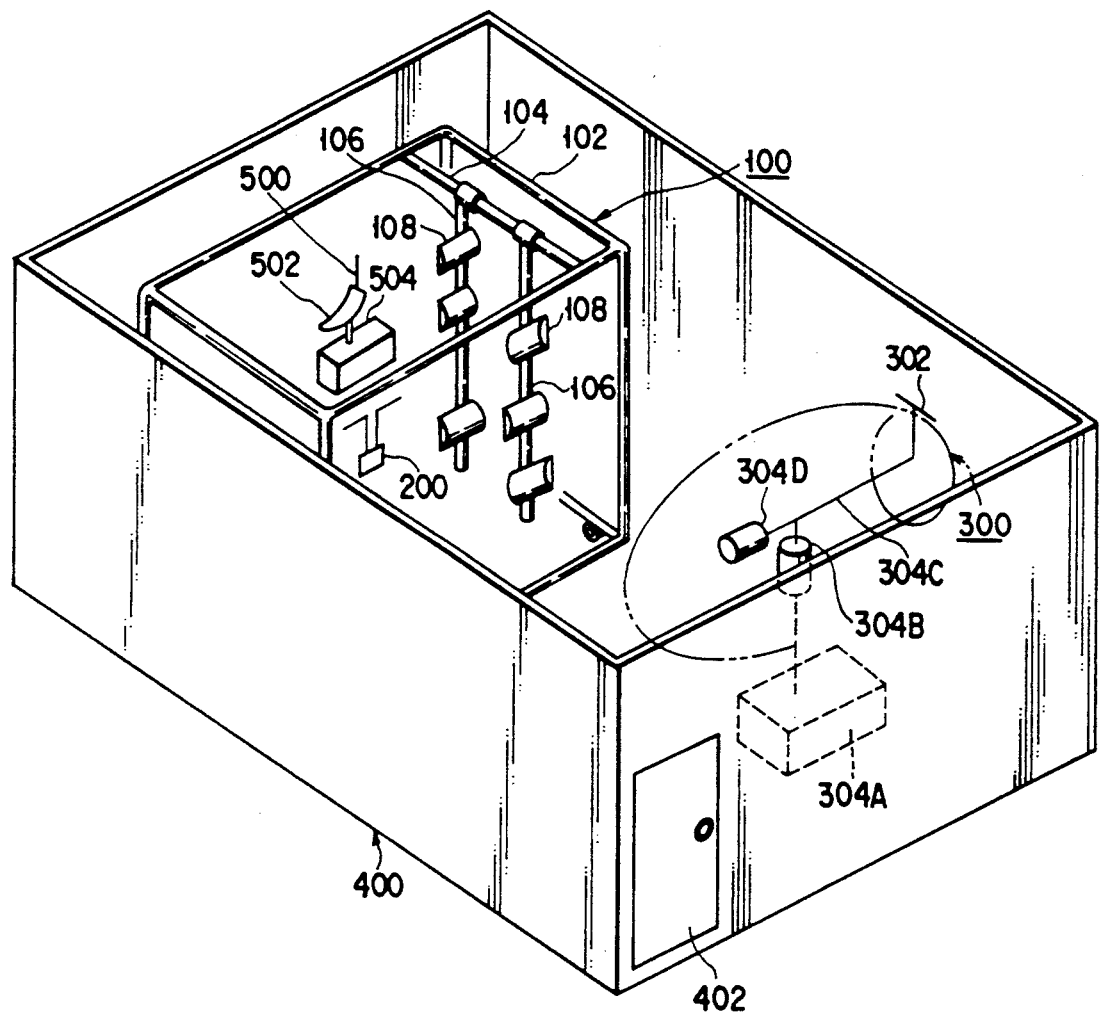
FIG. 2 is a perspective view showing schematically an apparatus for measuring antenna radiation efficiency according to an embodiment of the present invention.

An embodiment of the present invention will now be described with reference to the accompanying drawings. As is shown in FIG. 2, an apparatus for measuring antenna radiation efficiency according to the embodiment of the invention comprises a random field forming unit 100, a standard antenna 200 situated within the random field forming unit 100, a receiving antenna unit 300 situated apart from the random field forming unit 100, metallic walls 400 for enclosing the random field forming unit 100, standard antenna 200 and receiving antenna unit 300, and various electric/mechanical parts constituting a mechanism for driving the random field forming unit 100 (details will be described by referring to FIG. 18) and a mechanism for the receiving antenna unit 300.

This antenna radiation efficiency measuring apparatus can measure the antenna radiation efficiency of an antenna 500 to be measured (hereinafter called "to-be-measured antenna 500") using a random field measurement method, with high measurement efficiency and accuracy over a wide range of frequencies. The to-be-measured antenna 500 is situated within the random field forming unit 100.

The random field forming unit 100 comprises mainly a frame 102. The frame 102 is made of aluminum because of sufficient strength and easy manufacture; it is desirable, however, to make the frame 102 of non-magnetic and non-electrically-conductive material.

A radio communication device 502 having the to-be-measured antenna 500 and the standard antenna 200 is situated at a center region of the frame 102. A guide rail 104 is horizontally provided in the frame 102. A plurality of rods 106 are vertically attached to the guide rail 104. One end portion of each rod 106 is held to the guide rail 104, and the other end portion of each rod 106 is situated vertically downward. A plurality of radio wave scatterers 108 are held to each rod 106.

On the other hand, a receiving antenna 302 is situated at a suitable position outside the random field forming unit 100. The receiving antenna 302 receives radio waves from the to-be-measured antenna 500 and standard antenna 200. The receiving antenna 302 is attached to a rotary mechanism 304.

The rotary mechanism 304 has an elevation motor 304D and an azimuth motor 304B for rotating the receiving antenna 302 about two axes which are perpendicular to each other. Specifically, the rotary mechanism 304 comprises a base 304A installed on the floor, the azimuth motor 304B attached to the base 304A, an arm 304C rotated by the azimuth motor 304B in a horizontal plane, and the elevation motor 304D for rotating the arm 304C. The receiving antenna 302 is attached perpendicularly to an end portion of the arm 304C. Horizontal and vertical deviations of the receiving antenna 302 can be adjusted by the azimuth motor 304B and elevation motor 304D.

The metallic walls 400 prevent reflection of radio waves in the inside space defined by the walls 400 effectively, and enhance the effect of the radio wave scatterers 108 and a radio wave screening curtain (described later). The metallic walls 400 are provided with a door 402 through which an engineer for measurement can enter the inside space.

Figure 3:
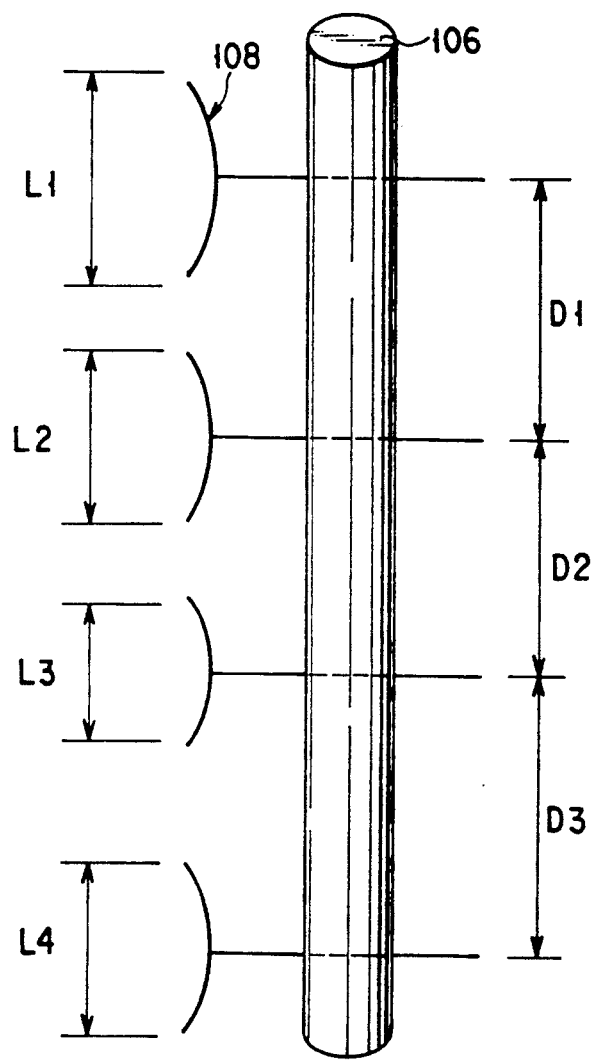
FIG. 3 illustrates the relationship between radio wave scatters and a rod.

Detailed structures of the parts shown in FIG. 2 will now be described with reference to the accompanying drawings. As is shown in FIG. 3, the radio wave scatterers 108 are provided on one rod 106 at predetermined intervals. The radio wave scatterers 108 have curvatures L1, L2 . . . which are determined at random according to a random number sequence. Similarly, intervals D1, D2 . . . between the radio wave scatters along each rod 106 are determined at random according to a random number sequence.

Each radio wave scatterers 108 has a plate member 108A, as an element for scattering radio waves, which is made of an elastic or flexible material. According to the preferred embodiment, each radio wave scatterer 108 has a rectangular aluminum plate 108A as an element for scattering radio waves. The curvature of each radio wave scatterer 108 is determined individually by a mechanism shown in FIG. 4.

Figure 4:
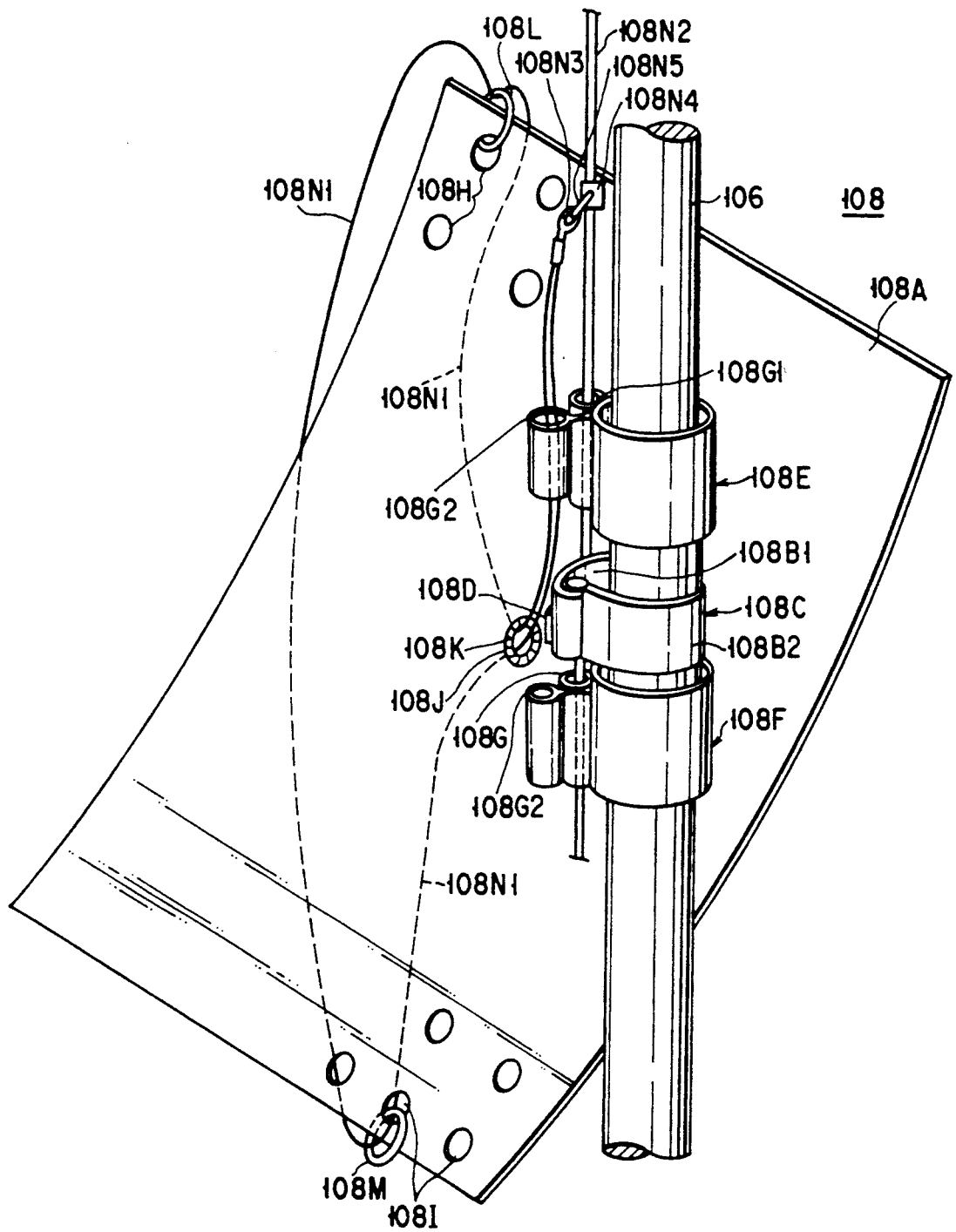
FIG. 4 is a perspective view showing a mechanism for expanding radio wave scatterers.

Referring to FIG. 4, the radio wave scatterers 108 will now be described in detail. A fixing attachment 108C having a pair of openable support members 108B1 and 108B2 is fixed, by means of an adhesive member 108D such as an adhesive double-coated tape, to a center portion of the aluminum plate 108A which is a main element of the radio wave scatterer 108. The closed support members 108B1 and 108B2 are coupled to the rod 106, whereby the aluminum plate 108A is fixed to the rod 106 via the fixing attachment 108C.

A ring 108E is attached to that part of the rod 106, which is above the fixing attachment 108C; and a ring 108F is attached to that part of the rod 106, which is below the fixing attachment 108C. Sleeves 108G1 and 108G2 are fixed to the rings 108E and 108F. An expansion wire 108N1 and a main wire 108N2 (described later) are passed through the sleeves 108G1 and 108G2. Only one of the rings 108E and 108F may be attached to the rod 106.

A plurality of first holes 108H are formed at one corner along one diagonal of the aluminum plate 108A, and a plurality of second holes 108I are formed at the opposite corner. A third hole 108J is formed at a center part of the aluminum plate 108A. A split ring 108K for protecting wire is engaged in the third hole 108J. First and second partially cut rings 108L and 108M are engaged in one of the first holes 108H and one of the second holes 108I, respectively. The expansion wire 108N1 for bending the aluminum plate 108 is passed through the rings 108K, 108L and 108M. The degree of bending of the plate 108A is adjusted by the extension degree of the expansion wire 108N1, thereby determining a desired curvature of the radio wave scatterer 108.

Both end portions of the expansion wire 108N1 are coupled to a clamp 108N3. A stopper 108N4 is fixed to the main wire 108N2. The stopper 108N4 and clamp 108N3 are coupled to each other by means of a ring 108N5. The main wire 108N2 passes through the upper and lower sleeves G1 and extends along the rod 106. The stopper 108N4 fixed to the main wire 108N2 is coupled to the clamp 108N3 via the ring 108N5.

A middle portion of the expansion wire 108N1 is situated along one diagonal of the aluminum plate 108A. One end portion of the expansion wire 108N1 passes through the first ring 108L, the third hole 108J and then the sleeve 108G2, and is clamped by the clamp 108N3. The other end portion of the expansion wire 108N1 passes through the second ring 108M, the third hole 108J and then the sleeve 108G2, and is clamped by the clamp 108N3.

When the main wire 108N2 is pulled by a winding mechanism (described later) by a predetermined length (SL), the aluminum plate 108A of the radio wave scatter 108 is completely expanded. In this state, the expansion wire 108N1 is pulled by a stroke of 2×SL. Thereby, the aluminum plate 108A of the radio wave scatterer 108 is expanded. Accordingly, the radius of curvature of the radio wave scatterer 108 is determined by the positions of holes of 108H and 108I to which the rings 108L and 108M are coupled (see FIG. 5).

As, is shown in FIGS. 3 and 4, the radio wave scatterers 108 are attached to each rod 110. The length, of the expansion wire 108N1 of each radio wave scatterer 108 is determined on the basis of the combination of the holes 108H and 108I to which the rings 108L and 108M are fixed. Specifically, the length of the expansion wire 108N1 is determined such that the curvatures of the radio wave scatterers 108 become random when the main wire 108N2 is pulled by the stroke of SL. FIG. 5 shows the state wherein the expansion wire 108N1 is pulled and the radio wave scatterer 108 is expanded at a predetermined curvature.

Since the rings 108L and 108M are removable, the curvature of the radio wave scatterer 108 can be varied by attaching the rings 108L and 108M to desired ones of the holes 108H and 108I determined by the random number sequence, on an as-needed basis.

As stated above, the curvatures and intervals of the radio wave scatterers 108 are determined at random, and random curvatures can be easily achieved by merely pulling the main wire 108N2. Further, the characteristics of the radio wave scatterers 108 can be controlled, where necessary, by changing the holes 108H and 108I to which the rings 108L and 108M are fixed and thereby varying the curvatures of the radio wave scatterers 108. Thus, the characteristics at a specific frequency and at a specific location can be enhanced.

Figure 6:
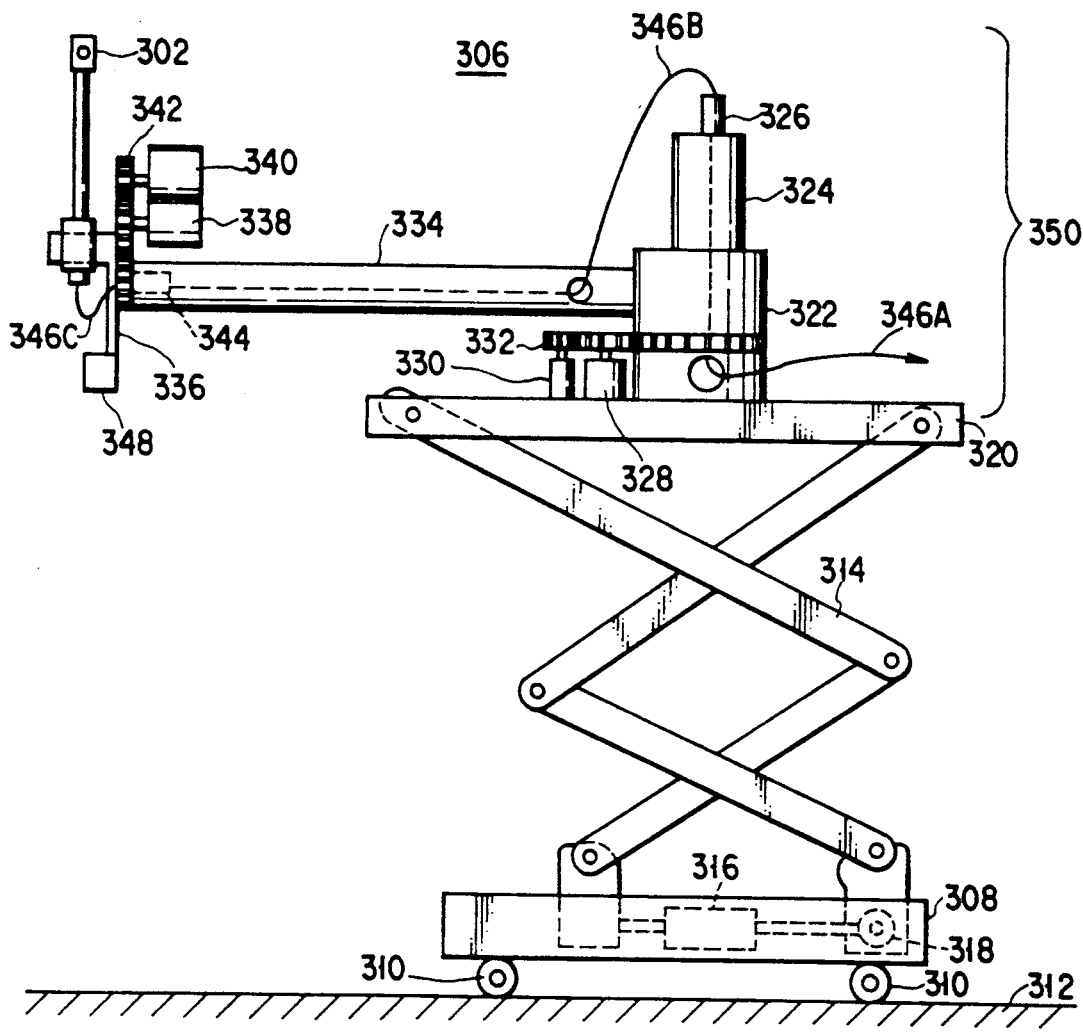
FIG. 6 shows in detail a mechanism for driving a receiving antenna.

Referring to FIG. 6, a preferred embodiment of the rotary mechanism for the receiving antenna 302 will now be described. As is shown in FIG. 6, a rotary mechanism 306 for rotating the receiving antenna 302 has a carriage 308. The carriage 308 is provided with wheels 310. Thus, the carriage 308 can move to a desired position on the floor. The carriage 308 is provided with a vertically movable stage 314. The stage 314 is driven by a cylinder 316 and a hinge roller 318 provided in the carriage 308. Reciprocal movement of the cylinder 316 is converted to vertical movement of the vertically movable stage 314 by means of the hinge roller 318.

A table 320 is placed on the vertically movable stage 314. A rotary base 322 is rotatably placed on the table 320. The rotary base 322 has a vertical rotational axis. The rotary base 322 has a passageway for passing a coaxial cable 346A through the base 322. A rotary connector 324 is situated on the rotary base 322. A rotary joint 326 is situated on the rotary connector 324.

In addition, an azimuth motor 328, a rotary encoder 330 and a gear mechanism 332 are provided on the table 320. The rotary base 322 is rotated by the azimuth motor 328 via the gear mechanism 332. The rotary base 322, rotary connector 324 and rotary joint 326 are integrated as one body. In accordance with the rotation of the rotary base 322, the rotary connector 324 and rotary joint 326 are rotated.

A first longitudinal end portion of an arm 334 is fixed to the rotary connector 324. A rotary plate 336 for supporting the receiving antenna 302 is rotatably supported on a second longitudinal end portion of the arm 334. The rotational shaft of the rotary plate 336 is the arm 334. The second longitudinal end portion of the arm 334 is provided with an elevation motor 338, an encoder 340 and a gear mechanism 342. The rotary plate 336 can be rotated by the elevation motor 338 via the gear mechanism 342. The arm 334 has a longitudinal passageway for passing a relay coaxial cable 346B through. Further, a rotary joint 344 is provided at the second longitudinal end portion of the arm 334.

A coaxial cable 346C led from the receiving antenna 302 is connected to one end portion of the rotary joint 344. The end portion of the rotary joint 344 is connected to one end portion of the relay coaxial cable 346B running through the passageway in the arm 334. The other end portion of the cable 346B is connected to one end portion of the rotary joint 326. The other end portion of the rotary joint 326 is connected to one end portion of the coaxial cable 346A via the rotary connector 324. The other end portion of the coaxial cable 346A is connected to a receiver (not shown). A counterweight 348 is attached to an end portion of the rotary plate 336. A cable (not shown) for supplying power to the elevation motor 338 and a cable (not shown) for receiving a signal from the rotary encoder 330 are, like the relay coaxial cable 346B, led to an external control system via the rotary connector 324 and rotary joint 326.

The rotary mechanism 306 operates as follows. The rotary plate 336 is rotated by the elevation motor 338, thereby enabling the receiving antenna 302 to receive various polarized waves (radio waves) in the best condition. The received signal from the antenna 302 is led to the receiver (not shown) through the coaxial cables 346C, 346B and 346A.

Since the direction of the polarized waves received by the receiving antenna 302 is indicated by the rotational angle of the elevation motor 338, this direction can be detected by the rotary encoder 340. In addition, the rotational angle of the azimuth motor 328 is detected by the rotary encoder 330.

Since an upper section 350 on the table 320 is vertically moved as one body by the vertically movable stage 314, the receiving antenna 302 can measure field strength in a wide range and the precision of radiation efficiency measurement can be enhanced.

Figure 7:
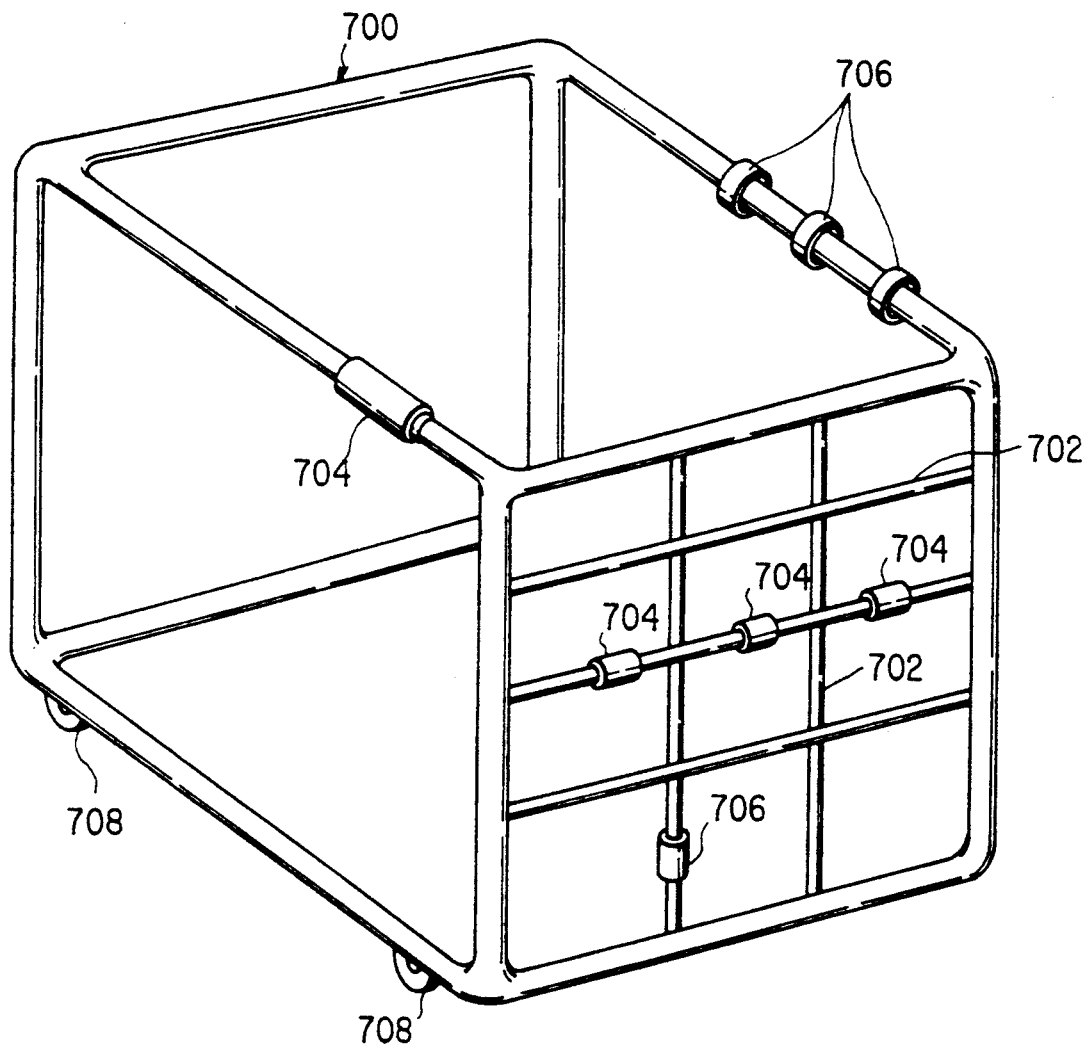
FIG. 7 is a perspective view shows a radio wave scatterers holding frame.

A frame 700 different from the above-described frame 102 will now be described with reference to FIG. 7. The frame 700 has a plurality of curtain frames 702 for holding a radio wave screening curtain 600 (described later). Insulating members 704 are provided at suitable intervals along the longitudinal direction of the curtain frames 702. Ferrite rings 706, along with the insulating members 704, are provided on the curtain frames 702. Thereby, the curtain frames are insulated from radio-frequency waves, and unnecessary resonance phenomenon due to the curtain frames 702 can be prevented. Similarly, the insulating members 704 and ferrite rings 706 may be provided on the frame 700. The frame 700 and curtain frames 702 are partially made of metal; however, these may be made of substantially non-metallic structures. Further, since the frame 700 is provided with castors 508, it can be moved to a desired position.

As is shown in FIG. 8, the radio wave screening curtain 600 is provided on that part of the frame 700, where the curtain frames 702 are arranged. Of course, the positions of the curtain frames 702 and radio wave screening curtain 600 is not limited to this. An upper roller 602 is disposed at the upper part of the frame 700. The radio wave screening curtain 600 is wound around the upper roller 602. One end of the curtain 600 is pulled by a holding rod 606 via an intermediate roller 602. The holding rod 606 is pulled by a pulling wire 608. A winding drum 610 is disposed at the lower part of the frame 700. The pulling wire 608 is wound by the drum 610, thereby unfolding the curtain 600 at the desired position of the frame 500. The winding drum 610 is driven by a motor 612.

Using this mechanism, the radio wave screening curtain 600 can be unfolded, folded, and semi-folded. Thereby, the degree of scattered radio waves in the frame 700 can be adjusted, and measurement precision enhanced.

In FIG. 8, the pulling wire 608 is employed, but the radio wave screening curtain 600 can be directly wound around the winding drum 610. In addition, in FIG. 8, the winding drum 610 is driven by the motor 612, but it can be driven manually.

Referring to FIGS. 9A to 9C, the detailed structure of the radio wave screening curtain 600 will now be described. In FIGS. 9A and 9B, hatched portions are metallic portions 602, and the other portions are non-metallic portions 604. In this embodiment, the metallic portions 602 are formed of metallic sheets, and the non-metallic portions 604 are of non-metallic sheets. The portions 602 and 604 may be integrated; alternatively, a non-metallic base sheet is used, and metallic sheets may be superposed on the hatched areas of the base sheet, thus forming the radio wave screening curtain 600.

FIG. 9A shows a pattern of metallic portions 602 and non-metallic portions 604 of a radio wave screening curtain 600A for high frequencies, and FIG. 9B shows a pattern of a radio wave screening curtain 600B for low frequencies. FIG. 9C shows a strip-shaped pattern formed by coupling radio wave screening curtains 600A to 600D, and the ratio of metallic portions differs between the respective curtains 600A to 600D. The dimension HF of each radio wave screening curtain 600A to 600D corresponds to the height of the frame 102 (700). With this structure, reflection efficiency is varied by selecting one of the radio wave screening curtains 600A to 600D, and the ratio of radio waves scattered in the radio wave scatter holding frame 102 (700) can be varied. Thus, measurement accuracy at a desired frequency can be enhanced.

Now referring to FIG. 10, an embodiment of a mechanism for remote-controlling the radio wave scatters 108 will be described. Guide rollers 110-1 to 110-N are movably attached to the guide rail 104, and rod blocks 112-1 to 112-N are attached to the guide rollers 110-1 to 110-N. The rods 106 (106-1 to 106-N) shown in FIGS. 2 and 3 are attached to the rod blocks 112-1 to 112-N. On the other hand, calking portions 118 for limiting the length of pulled wires are attached to intermediate wires 116 for connecting a winding wire 114 and rod blocks 112.

The winding wire 114 is wound by a winding roller 122 via a guide roller 120. First, the wire 114 is pulled until the calking portion 118-1 attached to the wire 114 abuts on the rod block 112-1. Thereafter, the rod block 112-1 moves to the left (in FIG. 10) and the intermediate wire 116-1 is pulled. Subsequently, similar actions occur in the next rod block 112-2 and intermediate wire 116-2. In FIG. 10, the calking portion 118-N has not yet abutted on the final rod block 112-N. Since all calking portions 118 abut on the rod blocks 112 except the final one, the main wire 108N2 is pulled, as described in connection with FIG. 4, and the expansion of the radio wave scatterers 108 is completed by the action of expansion wire 108N1. The winding roller 114 is driven by a winding motor 124.

With this structure, the curvature of each radio wave scatterer 108 can be remote-controlled by the winding wire 114.

Figure 10:
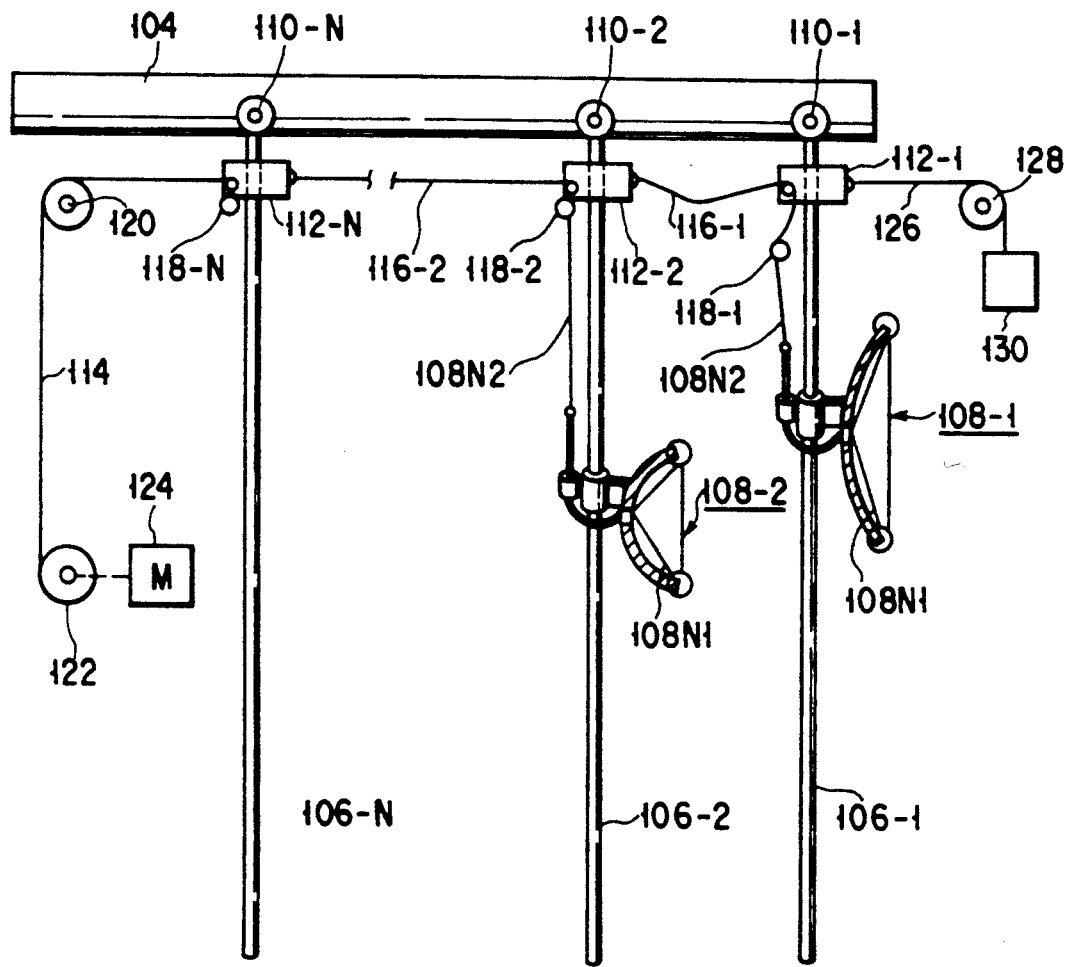
FIG. 10 shows a mechanism for remote-controlling the radio wave scatterers.

In the structure of FIG. 10, a rewind wire 126 is connected to the rod block 121-1. The rewind wire 126 is pulled by a constant torque 130 via a roller 128. When the winding motor 124 is rotated in a direction reverse to the direction of winding, the intermediate wires 116 are rewound by the constant torque 130. Accordingly, the rod blocks 112, rods 106 and radio wave scatterers 108 are moved to the right (in the figure) and stored. In this case, each radio wave scatterer 108 takes a flat shape for efficient storage.

In addition, the curvature of each radio wave scatterer 108 can easily be varied by winding or rewinding the winding wire 114 at a suitable stroke on an as-needed basis.

Figure 11:
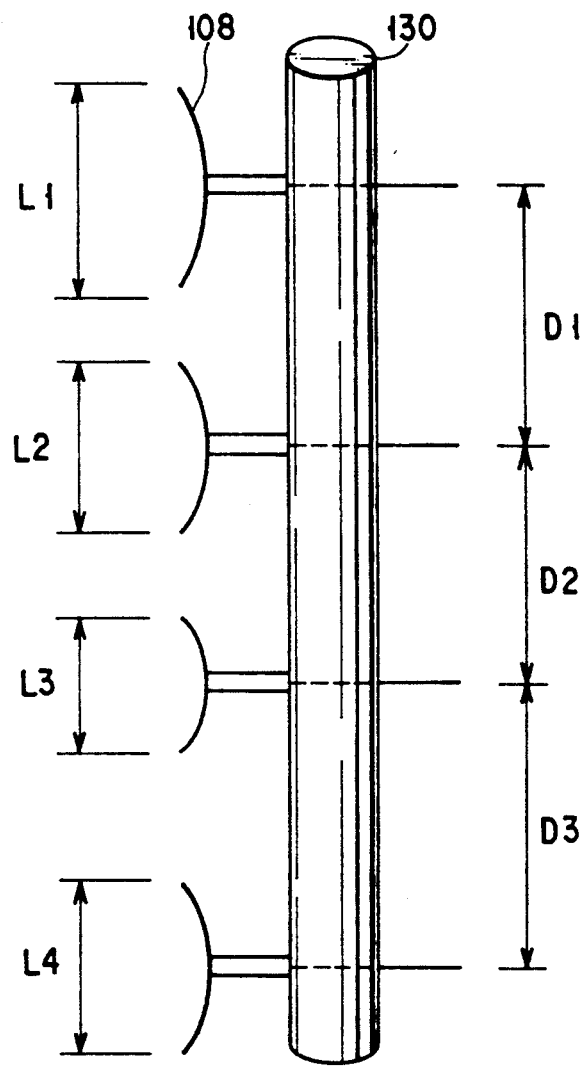
FIG. 11 shows radio wave scatters and an insulative rod.
Figures 12, 13:
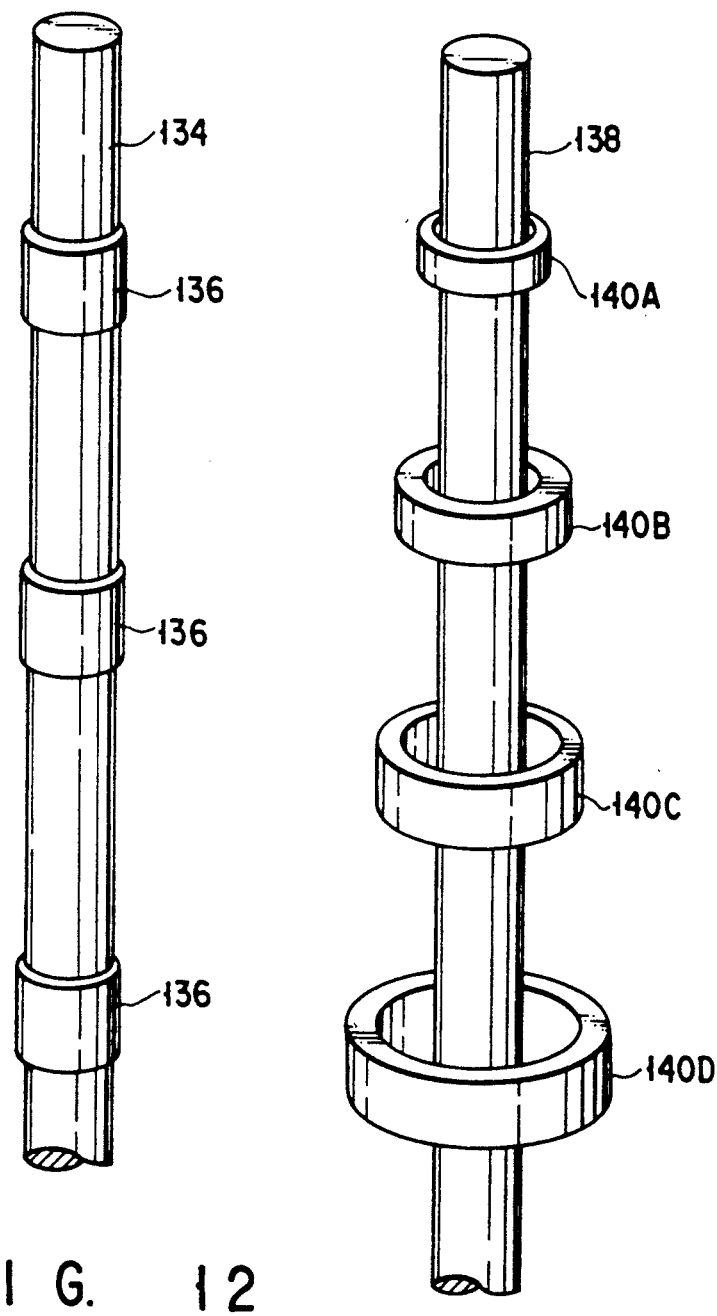
FIG. 12 shows a division-type, metallic rod.
FIG. 13 shows radio wave scatterers and a ferrite rod.

FIGS. 11 to 13 show other embodiments of the rods for holding the radio wave scatterers 108. In FIG. 11, rod 130 is formed of an insulating material, and radio wave scatterers 108 are attached to the rod 130. The curvatures L1, L2, ... and intervals D1, D2, ... of the radio wave scatterers 108 are determined by a random number sequence. If the rods 130 are made of insulating material, resonance due to the rods 130 can be prevented.

FIG. 12 shows a rod 134 of a metallic material. The rod 134 is divided along its longitudinal axis, and the divided portions are coupled by joints 136 of an insulating material. In this case, the length of each divided portion of the rod 134 is made less than the wavelength of measurement and non-uniform, thereby preventing resonance at a specific frequency.

FIG. 13 shows a rod 138 of a metallic material. Unlike the rod 134 of FIG. 12, the rod 138 is one piece and is provided with ferrite rings 140A to 140D at given locations. According to this structure, the metallic rod 138 is insulated from radio-frequency waves at locations of the ferrite rings 140A to 140D, thereby preventing resonance, as with the rods of FIGS. 11 and 12.

Since the rod of FIG. 13 is made of a metallic material as a single piece, the mechanical strength thereof can be increased, compared to the rod 130 of an insulating material shown in FIG. 11, or the rod 134 of a metallic material shown in FIG. 12 which consists of divided portions coupled by insulating joints 136. There are instances where the ferrite material will not function in a wide band; however, resonance can be prevented over a wide range by selecting the size (diameter, thickness) of the ferrite ring 140 and the location where it is attached, as shown in FIG. 13.

Figure 14:
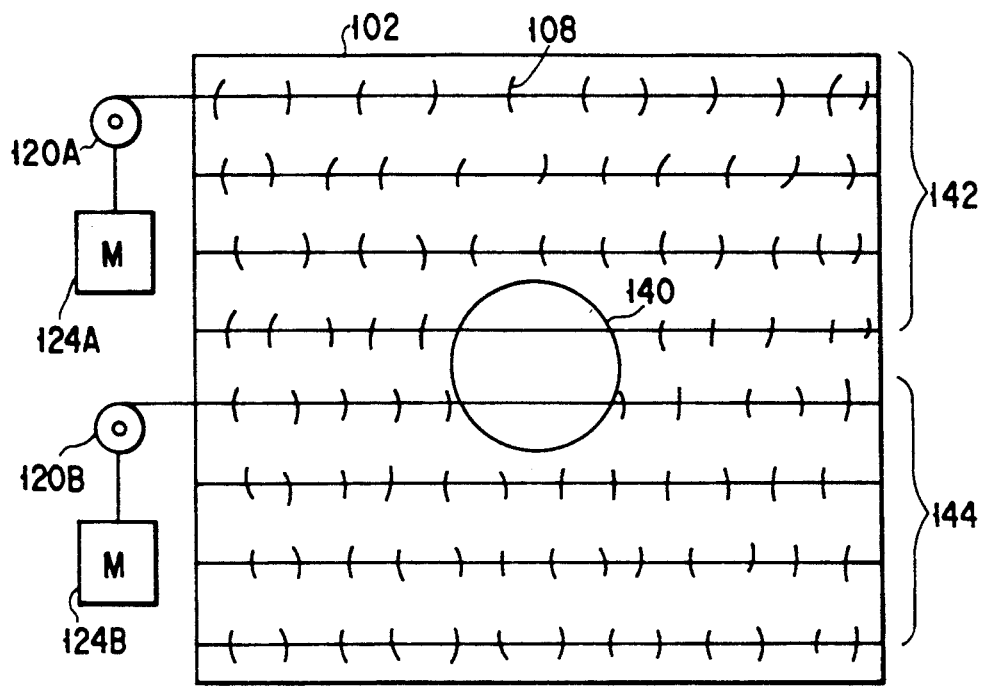
FIG. 14 is a plan view showing division-, expansion- and storage-type radio wave scatterers and a mechanism for driving the radio wave scatterers.
Figure 15:
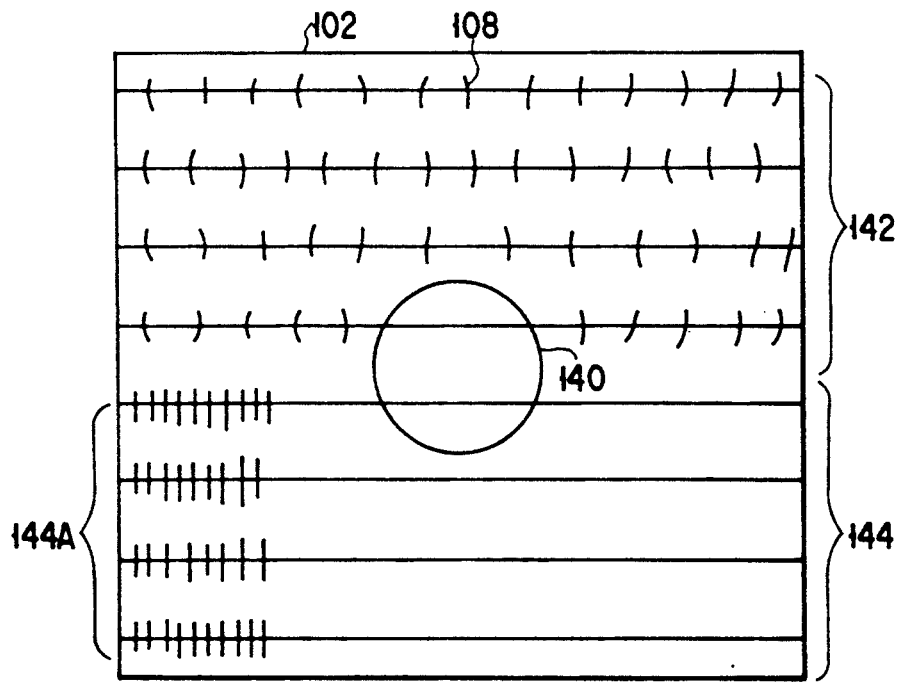
FIG. 15 is a plan view showing the state in which some of the division-, expansion- and storage-type radio wave scatterers.

FIG. 14 is a plan, view showing the arrangement of the radio wave scatterers 108 in the frame 102 (or 700). A measurement space 140 where no radio wave scatterer 108 is situated is created at the center of the frame 102. The radio wave scatterers 108 are arranged around the measurement space 140. The radio wave 108 are divided into the left and right blocks 142 and 144. The radio wave 108 of each block 142, 144 are independently expanded and stored by a roller 120A, 120B and a motor 124A, 124B. In the block 142 of FIG. 15, all radio wave scatterers 108 are expanded; on the other hand, in the block 144 of FIG. 15, all radio wave scatterers 108 are stored (144A).

The radio communication device 502 and the to-be-measured antenna 500 shown in FIG. 2 are inserted into the measurement space 140 in the following manner. The motor 124B in FIG. 14 is driven and the radio wave scatterers 108 of one block 144 are stored (144A). Thereby, the radio wave scatterers 108 do not obstruct the carrying-in of the radio communication device 502 and to-be-measured antenna 700 into the measurement space 140, resulting in higher working efficiency. This is a remarkable advantage, compared to the conventional structure wherein the radio wave scatterers are always provided.

Figure 16:
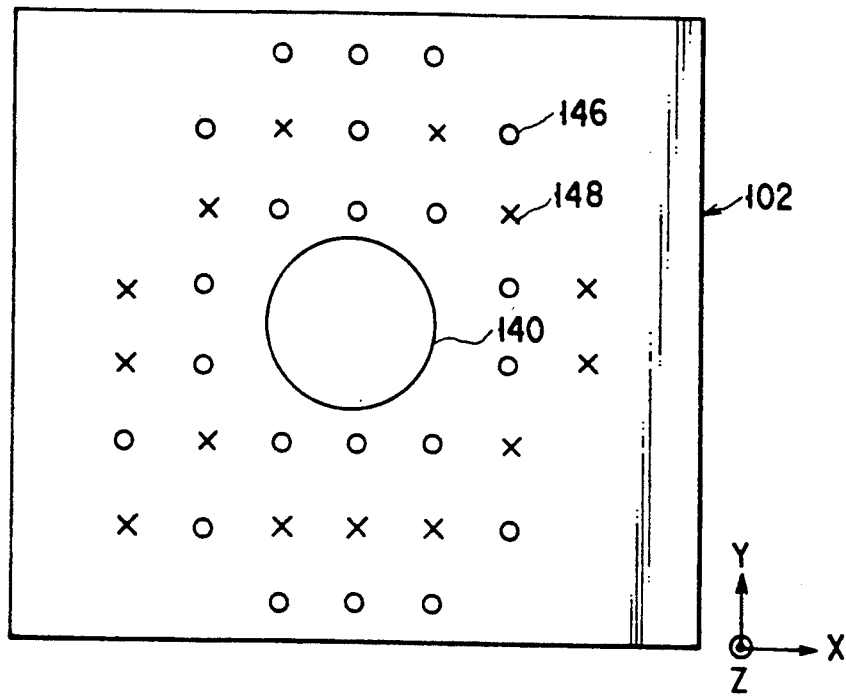
FIG. 16 is a plan view for illustrating a ½ offset arrangement of the radio wave scatterers.
Figure 17:
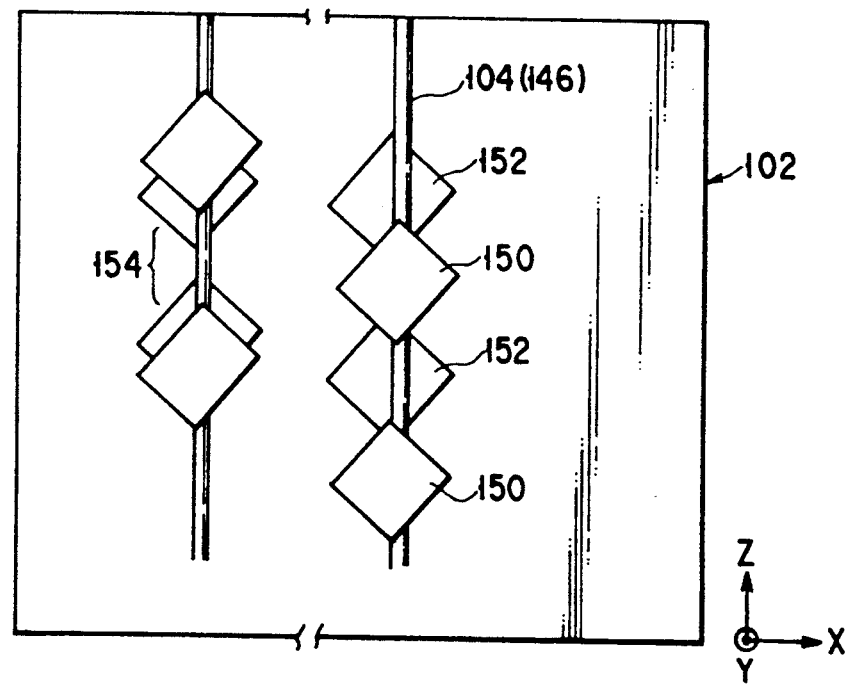
FIG. 17 is a side view for comparing the ½ offset arrangement of the radio wave scatterers and other arrangement.

A more effective arrangement of the radio wave scatterers will now be described with reference to FIGS. 16 and 17. FIG. 16 is a plan view schematically showing the arrangement of rods 104 in the frame 102, and FIG. 17 shows the vertical arrangement of the radio wave scatterers 150, 152 on the rods 104. As shown in FIG. 16, the rods 104 are divided into a group 146 (O) and a group 148 (X). As is shown in FIG. 17, radio wave scatterers 150 attached to the rod 104 of the group 146 are offset from the radio wave scatterers 152 of the adjacent rod 104 by ½ of an average interval between the radio wave scatterers on the same rod 104.

Unless this structure is adopted, a gap 154 occurs between the vertically adjacent radio wave, as shown in the left part of FIG. 17. If there is the gap 154, the receiving antenna 302 looks to the to-be-measured antenna 500 and standard antenna 200 directly through the gap 154, and the effect of the radio wave scatterer is degraded. If the radio wave scatterer 150 and 152 are offset by ½ of the average interval, as shown in the right part of FIG. 17, the gap 154 is not produced and the maximum effect of the radio wave scatterers can be obtained.

Figure 18:
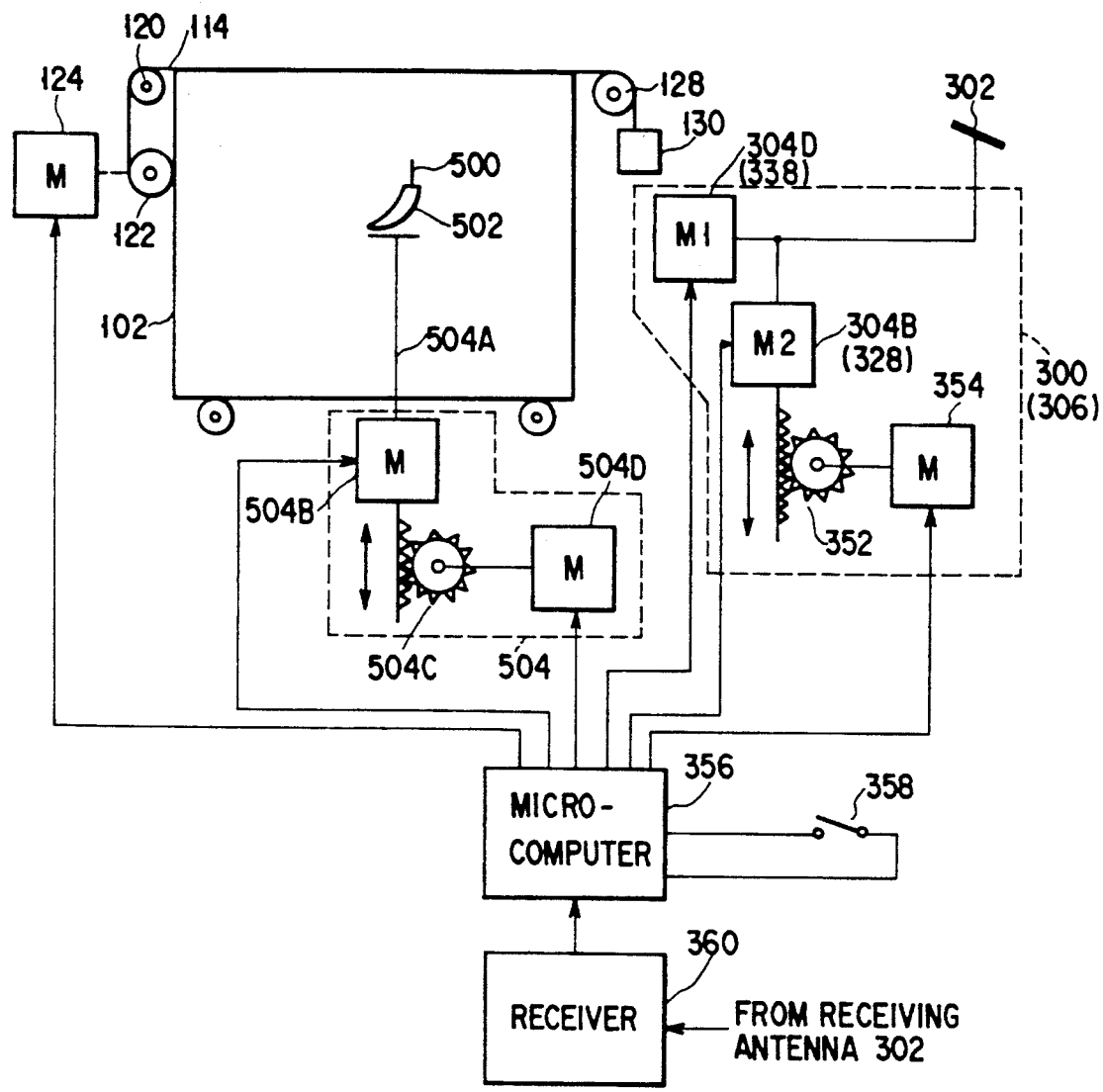
FIG. 18 is a diagram showing the structure of movable parts and control systems of the apparatus for measuring antenna radiation efficiency according to the embodiment of the present invention.

Referring to FIG. 18, the movable parts and control systems of the apparatus for measuring antenna radiation efficiency according to the embodiment of the present invention will now be described. The radio communication device 502 having the to-be-measured antenna 500 is rotated and vertically moved by a driving mechanism 504. The driving mechanism 504 comprises, as main parts, a vertical shaft 504A, a motor 504B, a gear mechanism 504C and a motor 504D.

The radio communication device 502 having the to-be-measured antenna 500 is connected to one end portion of the vertical shaft 504A. The other end portion of the vertical shaft 504A is connected to the rotary shaft of the motor 504B. Accordingly, when the motor 504B is rotated, the radio communication device 502 having the to-be-measured antenna 500 is rotated about the vertical shaft 504A. Further, when the motor 504D is rotated, the radio communication device 502 having the to-be-measured antenna 500 can be set at a desired height.

On the other hand, the receiving antenna 302 is rotated in multi-directions by the rotary mechanism 300 (306). That is, the rotary mechanism 300 (or 306) has the elevation motor 304D (or 338) and azimuth motor 304B (or 328). A gear mechanism 352 is driven by a motor 354. The gear mechanism 352 vertically moves the unit including the receiving antenna 302. This structure is substantially equivalent to the structure shown in FIG. 6. The gear mechanism 352 and motor 354 correspond to the cylinder 316 and hinge roller 318 shown in FIG. 6.

As has been described in connection with FIG. 10, the winding wire 114 is wound around the roller 122 via the guide roller 120 by means of the winding motor 124. The winding wire 114 is rewound by the constant torque 130 via the guide roller 128.

The motors 124, 504B, 504D, 304D (338), 304B (328) and 354 are controlled by a microcomputer 356. The microcomputer 356 is connected to a quick check switch 358. The switch 358 may be a hardware switch or may be a software switch by means of, e.g. input through a keyboard.

A signal received by the receiving antenna 302 is delivered to a receiver 360. A reception output proportional to a received field strength is input to the microcomputer 356. The microcomputer 356 controls the curvatures of the radio wave scatterers 108, polarized waves received by the receiving antenna 302, the position and height of the receiving antenna 302, and the direction and height of the to-be-measured antenna 500.

The principle of antenna radiation efficiency measurement according to the present embodiment will now be described. The antenna radiation efficiency measurement of this embodiment is based on the fact that the cumulative distribution of received power of the receiving antenna 302 exhibits a Rayleigh distribution.

According to the radio wave scatters 108 and at least one radio wave screening curtain 600 of the present embodiment, radio waves emitted from the to-be-measured antenna 500 in all directions can be received by the receiving antenna 302 at a uniform ratio. By controlling the radio wave scatterers 108 and at least one radio wave screening curtain 600, a cumulative distribution of received power which exhibits a Rayleigh distribution can be obtained.

In order to measure the antenna radiation efficiency at high precision, it is necessary that the 50% value of the received power of the to-be-measured antenna 500 in various states be substantially constant even if the direction, height and position of the to-be-measured antenna 500. In order to confirm that the 50% value of the received power is constant, a cumulative distribution based on many data items is not required. That is, in order to obtain a 1% value or a 99% value of received power, many data items are required; however, when the cumulative distribution of received power exhibits a Rayleigh distribution, the number of data items required for obtaining the 50% value is about 32.

The inventors have experimentally confirmed that a Rayleigh property can easily be attained by the antenna radiation efficiency measuring apparatus according to the present invention. Accordingly, in order to achieve high-precision measurement of antenna radiation efficiency, it is very important to stabilize the 50% value and reduce the DDD value.

Accordingly, when the antenna radiation efficiency is measured by the antenna radiation efficiency measuring apparatus of the present invention, the check mode is first executed. In the check mode, a 50% value is obtained from data items of about 32 points, assuming that the data items exhibit a Rayleigh property. Subsequently, the direction and height of the to-be-measured antenna 500 are varied, and dispersion of the 50% value is found. Thereby, the measurement efficiency can be increased remarkably. In the prior art, data items of about 4000 points are measured, whereas in the present invention data items of about 32 points are measured. Thus, in the present invention the measurement efficiency is increased about 100 times, compared to the prior art.

According to the present invention, a check mode is provided for measurement. In the check mode, the direction and height of the to-be-measured antenna 500 or standard antenna 200 are varied. Data items of about 32 points or more are measured with respect to at least one of the direction, height and position of the to-be-measured antenna 500 or standard antenna 200, and, assuming that the data items show a Rayleigh distribution, a 50% value is obtained. This procedure is performed with respect to the directions, heights or positions of the to-be-measured antenna 500 or standard antenna 200. Based on dispersion of obtained 50% values, the operation of the measurement apparatus is confirmed.

As has been described above, in this invention, the curvatures, intervals and directions of the radio wave scatterers provided around the to-be-measured antenna and standard antenna can be set at random. Thus, no resonance occurs at a specific frequency, and a stable dispersion effect can be attained over a wide range of frequencies. Thus, antenna efficiency can be measured in a wide band.

In addition, since the radio wave scatterers are horizontally movable within the radio wave scatterer holding frame and are held to the vertically extending rods, the to-be-measured antenna and the standard antenna can easily be carried in and out. Thereby, the antenna efficiency can easily be measured.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for measuring antenna radiation, efficiency, comprising:
   a frame having an inside space;
   a random field forming unit, for forming a random field, said random field forming unit comprising at least two parts, said parts each arranged in the inside space of the frame, said parts each having a plurality of radio wave scatterers, and means for setting at random the intervals between the radio wave scatterers and the curvatures of the radio wave scatterers;
   a transmitting antenna, having a predetermined antenna radiation efficiency, situated within the random field, for transmitting predetermined radio waves;
   a to-be-measured antenna, situated within the random field, for transmitting predetermined radio waves, the antenna radiation efficiency of the to-be-measured antenna being unknown in advance;
   a receiving antenna, situated apart from the random field, for receiving radio waves from the transmitting antenna and the to-be-measured antenna;
   a field-strength meter for measuring a first cumulative probability of the receiving power corresponding to the transmitting antenna and a second cumulative probability of the receiving power corresponding to the to-be-measured antenna, in accordance with the radio waves received by the receiving antenna; and
   computation means for computing the antenna radiation efficiency of the to-be-measured antenna in accordance with the first cumulative probability of the receiving power, the second cumulative probability of the receiving power and the antenna radiation efficiency of the transmitting antenna.

2. The apparatus according to claim 1, wherein said to-be-measured antenna transmits radio waves in various directions by means of a driving mechanism.

3. The apparatus according to claim 1, wherein said receiving antenna is rotated about a vertical axis and a horizontal axis by an azimuth motor and an elevation motor, and the receiving antenna receives polarized waves in various directions.

4. The apparatus according to claim 1, wherein said receiving antenna is rotated about a vertical axis and a horizontal axis by an azimuth motor and an elevation motor, and the receiving antenna is vertically movable.

5. The apparatus according to claim 1, wherein each of said parts comprises a plurality of guide rails horizontally provided in the frame, a plurality of rods vertically attached to the guide rails, a plurality of radio wave scattering metallic plates, each connected to the plurality of rods, an expansion wire passing through at least two corner portions and a center portion of the plurality of radio wave scattering metallic plates, a main wire driving the expansion wire and driving means to release and pull the main wire and the expansion wire so as to set at random the intervals between the radio wave scattering metallic plates and the curvatures of the radio wave scattering metallic plates.

6. The apparatus according to claim 5, wherein said corner portions are st at two or more locations on the metallic plate.

7. The apparatus according to claim 5, wherein a vertical interval of the radio wave scattering metallic plates is offset from the radio wave scattering metallic plates of the adjacent rods by about ½ of an average interval between the radio wave scattering metallic plates.

8. An apparatus for measuring antenna radiation efficiency, comprising:
   a frame having an inside space;
   a first random field forming unit, for forming a first random field, arranged in a first region of the inside space of the frame, having a plurality of radio wave scatterers, and a first means for setting at random the intervals between the radio wave scatterers of said first random field forming unit and curvatures of the radio wave scatterers of said first random field forming unit;
   a second random field forming unit, for forming a second random field, arranged in a second region of the inside space of the frame, having a plurality of radio wave scatterers, and a second means for setting at random the intervals between the radio wave scatterers of said second random field forming unit and the curvatures of the radio wave scatterers of said second random field forming unit;
   a transmitting antenna having a predetermined antenna radiation efficiency, situated within a space enclosed by said first and second random fields, for transmitting predetermined radio waves;
   a to-be-measured antenna, situated within said space, for transmitting predetermined radio waves, the antenna radiation efficiency of the to-be-measured antenna being unknown in advance;
   a receiving antenna, situated apart from said space, for receiving radio waves from the transmitting antenna and the to-be-measured antenna;
   a receiver for receiving radio waves from the transmitting antenna via the receiving antenna, and for receiving radio waves from the to-be-measured antenna via the receiving antenna;
   a signal processor for measuring a first cumulative probability of the receiving power in accordance with the received radio waves, and for measuring a second cumulative probability of the receiving power in accordance with the received radio waves;
   first computation means for computing difference data of the receiving power at the same value of the cumulative probability of the receiving power, in accordance with the first and second cumulative probabilities of the receiving power; and second computation means for computing the antenna radiation efficiency of the to-be-measured antenna in accordance with the difference data of the receiving power computed by the first computation means and the antenna radiation efficiency of the transmitting antenna.

9. The apparatus according to claim 8, wherein at least one of the random field forming units includes at least two blocks consisting of the radio wave scatters and the rods.

10. The apparatus according to claim 9, wherein at least one of the random field forming units further comprises means for expanding and storing said at least two blocks in said at least one random field forming unit.

11. The apparatus according to claim 8, wherein said to-be-measured antenna transmits radio waves in various directions by means of a driving mechanism.

12. The apparatus according to claim 8, wherein said receiving antenna is rotated about a vertical axis and a horizontal axis by an azimuth motor and an elevation motor, and the receiving antenna receives polarized waves in various directions.

13. The apparatus according to claim 8, wherein said receiving antenna is rotated about a vertical axis and a horizontal axis by an azimuth motor and an elevation motor, and the receiving antenna is vertically movable.

14. The apparatus according to claim 8, wherein said first random field forming unit comprises a plurality of guide rails horizontally provided in the frame, a plurality of rods vertically attached to the guide rails, a plurality of radio wave scattering metallic plates, each held to the plurality of rods, an expansion wire passing through at least two corner portions and a center portion of the plurality of radio wave scattering metallic plates, a main wire driving the expansion wire, and first driving means to release and pull the main wire and the expansion wire so as to set at random the intervals between the radio wave scattering metallic plates of said first random field forming unit and curvatures of the radio wave scattering metallic plates of said first random field forming unit; and said second random field forming unit comprises a plurality of guide rails horizontally provided in the frame, a plurality of rods vertically attached to the guide rails, a plurality of radio wave scattering metallic plates, each held to the plurality of rods, an expansion wire passing through at least two corner portions and a center portion of the plurality of radio wave scattering metallic plates, a main wire driving the expansion wire, and second driving means to release and pull the main wire and the expansion wire so as to set at random the intervals between the radio wave scattering metallic plates of said second random field forming unit and curvatures of the radio wave scattering metallic plates of said second random field forming unit.

15. The apparatus according to claim 14, wherein said corner portions are set at two or more locations on the metallic plate.

16. The apparatus to claim 14, wherein a vertical interval of the radio wave scattering metallic plates attached to the rods is offset from the radio wave scattering metallic plates of the adjacent rods by about ½ of an average interval between the radio wave scattering metallic plates.

* * * * *